(12) United States Patent
Yamada

(10) Patent No.: US 8,964,082 B2
(45) Date of Patent: Feb. 24, 2015

(54) SOLID-STATE IMAGE PICKUP ELEMENT, DISTANCE DETECTING APPARATUS INCLUDING SOLID-STATE IMAGE PICKUP ELEMENT, AND CAMERA INCLUDING DISTANCE DETECTING APPARATUS

(71) Applicant: Canon Kabushiki Kaisha, Tokyo (JP)

(72) Inventor: Daisuke Yamada, Cambridge, MA (US)

(73) Assignee: Canon Kabushiki Kaisha, Tokyo (JP)

( * ) Notice: Subject to any disclaimer, the term of this patent is extended or adjusted under 35 U.S.C. 154(b) by 165 days.

(21) Appl. No.: 13/680,402

(22) Filed: Nov. 19, 2012

(65) Prior Publication Data

US 2013/0128085 A1    May 23, 2013

(30) Foreign Application Priority Data

Nov. 21, 2011   (JP) .................. 2011-253462

(51) Int. Cl.
*H04N 3/14* (2006.01)
*H04N 5/232* (2006.01)
*H04N 5/335* (2011.01)
*H04N 5/369* (2011.01)
*H01L 27/146* (2006.01)

(52) U.S. Cl.
CPC ............ *H04N 5/335* (2013.01); *H04N 5/3696* (2013.01); *H01L 27/14627* (2013.01); *H01L 27/1464* (2013.01); *H01L 27/14641* (2013.01)
USPC ......................................... 348/308; 348/350

(58) Field of Classification Search
USPC .......... 348/294, 296, 302, 308, 345, 349, 350
See application file for complete search history.

(56) References Cited

U.S. PATENT DOCUMENTS

| | | | | |
|---|---|---|---|---|
| 7,825,966 | B2 * | 11/2010 | Manabe et al. ............... | 348/248 |
| 8,072,529 | B2 * | 12/2011 | Murakami .................... | 348/335 |
| 8,471,952 | B2 * | 6/2013 | Awazu .......................... | 348/350 |
| 2005/0064613 | A1 * | 3/2005 | Takeuchi et al. ................. | 438/24 |
| 2010/0327332 | A1 * | 12/2010 | Okino et al. ................... | 257/292 |
| 2012/0002089 | A1 * | 1/2012 | Wang et al. ..................... | 348/297 |
| 2012/0038904 | A1 * | 2/2012 | Fossum et al. ............... | 356/5.09 |

FOREIGN PATENT DOCUMENTS

JP           4027113 A       12/2007

* cited by examiner

*Primary Examiner* — Timothy J Henn
(74) *Attorney, Agent, or Firm* — Canon USA, Inc. IP Division

(57) ABSTRACT

A solid-state image pickup element includes a pixel and a signal detecting unit. The pixel has at least two photoelectric conversion units including a first photoelectric conversion unit and a second photoelectric conversion unit in a semiconductor. The first photoelectric conversion unit has a higher impurity density than the second photoelectric conversion unit and is configured to allow the transfer of a charge occurring in the second photoelectric conversion unit to the first photoelectric conversion unit. The signal detecting unit commonly detects the charge amount in the first photoelectric conversion unit and the second photoelectric conversion unit.

11 Claims, 10 Drawing Sheets

SOLID-STATE IMAGE PICKUP ELEMENT, DISTANCE DETECTING APPARATUS INCLUDING SOLID-STATE IMAGE PICKUP ELEMENT, AND CAMERA INCLUDING DISTANCE DETECTING APPARATUS

BACKGROUND OF THE INVENTION

1. Field of the Invention

One disclosed aspect of the embodiments relates to solid-state image pickup elements, distance detecting apparatuses including the solid-state image pickup element, and cameras including the distance detecting apparatus, and it particularly relates to a solid-state image pickup element for distance detection such as a digital still camera or digital video camera.

2. Description of the Related Art

A solid-state image pickup element has been proposed (Japanese Patent No. 4027113) which detects a distance by a phase difference detection method with distance detection pixels having a distance detection (focal point detection) function as a part or all of pixels of the solid-state image pickup element in a digital still camera or a video camera, for example. Each of the distance detection pixels here has a plurality of photoelectric conversion units. A light flux having passed through different areas of an exit pupil of an imaging lens is guided to different photoelectric conversion units. The plurality of thus configured distance detection pixels are used to detect images (Image A, Image B), formed by light fluxes having passed through different areas of the exit pupil and measure the amount of displacement between Image A and Image B. The amount of defocus is calculated from the amount of displacement and a base length (an interval between different areas of the exit pupil) to detect the distance (focal point position).

However, in a solid-state image pickup element according to the conventional example, since distance detection pixels have a plurality of photoelectric conversion units require a plurality of signal detecting circuits for reading signals from the photoelectric conversion units. The plurality of signal detecting circuit may lower the aperture ratio of the photoelectric conversion units (the ratio of the photoelectric conversion units occupying the pixels) and prevent efficient reception of light from a subject at all times. As a result, the SN ratio of the ranging signal may be deteriorated, and the number of distance detection errors may increase.

SUMMARY OF THE INVENTION

In view of the problems, one embodiment provides a solid-state image pickup element for distance detection such as a digital still camera or digital video camera which may increase the aperture ratio of a distance detection pixel and improve the accuracy of distance detection with a high SN ratio.

A solid-state image pickup element according to an aspect of the embodiments includes a pixel having at least two photoelectric conversion units including a first photoelectric conversion unit and a second photoelectric conversion unit in a semiconductor and one signal detecting unit which commonly detects the charge amount in the first photoelectric conversion unit and the second photoelectric conversion unit. In this case, the first photoelectric conversion unit has a higher impurity density than the second photoelectric conversion unit and is configured to allow a transfer of a charge occurring in the second photoelectric conversion unit to the first photoelectric conversion unit.

A distance detecting apparatus according to another aspect of the embodiments includes a solid-state image pickup element having a plurality of pixels, detecting images formed by light fluxes having passed through different areas of an exit pupil of an imaging lens by using the plurality of pixels and detecting a distance based on an amount of displacement of the images. In this case, the solid-state image pickup element having the plurality of pixels is configured by the aforementioned solid-state image pickup element.

A camera according to another aspect of the embodiments includes the aforementioned distance detecting apparatus.

Further features of the disclosure will become apparent from the following description of an exemplary embodiment with reference to the attached drawings.

DESCRIPTION OF THE EMBODIMENTS

A distance detecting apparatus including a solid-state image pickup element according to an embodiment of the disclosure will be described below. A digital still camera will be described below as an example in which the distance detecting apparatus including a solid-state image pickup element is applied to a solid-state image pickup apparatus, but the disclosure is not limited thereto. Embodiments of the disclosure will be described with reference to drawings. Same numbers refer to same functions throughout the drawings, and repetitive descriptions will be omitted.

Figure 1:
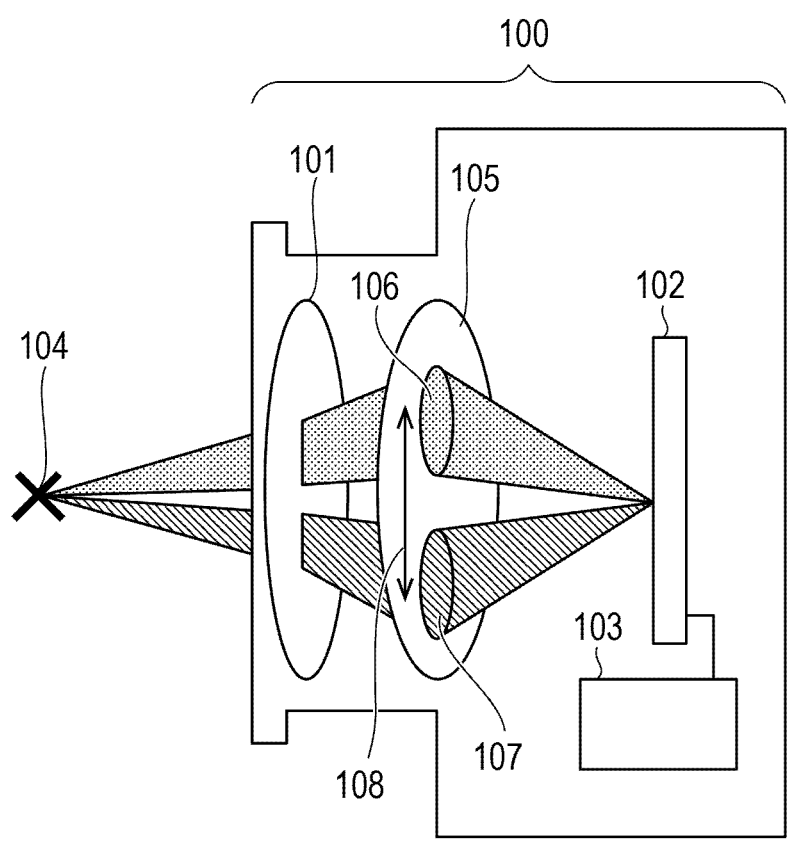
FIG. 1 illustrates a distance detecting apparatus having a solid-state image pickup element according to an embodiment.

First, a configuration of a distance detecting apparatus according to an embodiment will be described with reference to FIG. 1. Referring to FIG. 1, a distance detecting apparatus 100 according to this embodiment includes an imaging lens 101, a solid-state image pickup element 102, and an operating unit 103. In order to acquire distance information on a subject 104, the imaging lens 101 forms the image of the subject 104 on solid-state image pickup element 102. Distance detection pixels provided in the solid-state image pickup element 102 receives light fluxes having passed through different areas of the exit pupil 105 (first area 106, second area 107). Information pieces on Image A and Image B acquired through the different areas of the exit pupil are transferred to the operating unit 103. The amount of displacement of Image A and Image B and a base length 108 are used to calculate distance information on the subject by a publicly known method.

Figure 2:
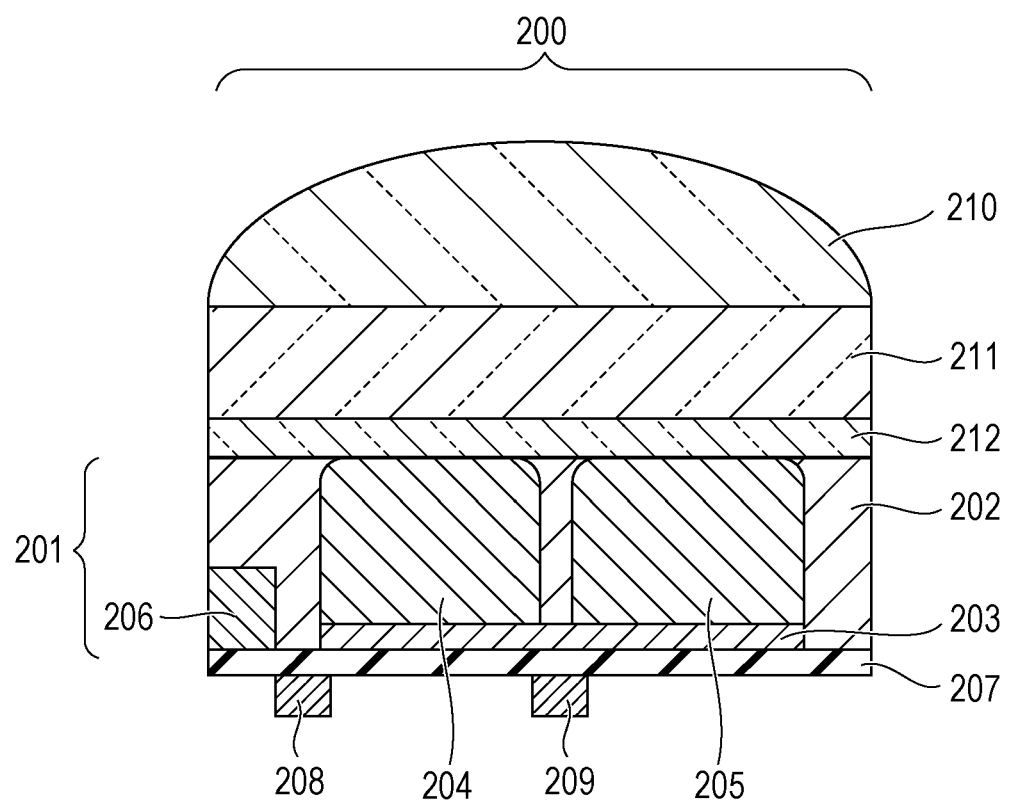
FIG. 2 is a schematic section view of a distance detection pixel of the solid-state image pickup element according to an embodiment.

Next, a configuration of the solid-state image pickup element will be described with reference to FIG. 2. Referring to FIG. 2, a pixel 200 is one of distance detection pixels partially provided in a solid-state image pickup element. The pixel 200 includes in a semiconductor 201 a P type well 202, a surface P+ layer 203, an N type first photoelectric conversion unit 204, a second photoelectric conversion unit 205, and a floating diffusion unit (hereinafter, FD unit) 206. A gate insulating layer 207 and gate electrodes 208 and 209 are disposed on the side having the surface P+ layer 203 of the semiconductor 201. The light beam having entered to the pixel 200 is guided through a light condensing unit 210 such as a microlens, a color filter 211, and a planarizing layer 212 to the first photoelectric conversion unit 204 and the second photoelectric conversion unit 205. The light beams entering to the photoelectric conversion units 204, 205 are converted to charges (electrons) and are stored within the photoelectric conversion units. After that, the charges are transferred to the same FD unit (signal detecting circuit) 206, and the charge amount of the first photoelectric conversion unit 204 and the charge amount of the second photoelectric conversion unit 205 are detected as electric signals. In this case, it is configured to efficiently transfer the charge of the second photoelectric conversion unit to the first photoelectric conversion unit such that the impurity density of the first photoelectric conversion unit 204 may have a higher impurity density than the impurity density of the second photoelectric conversion unit 205. For example, a microlens is used as the light condensing unit 210 so that the microlens may satisfy a substantially conjugate relationship between the exit pupil 105 and the surfaces of the photoelectric conversion units 204, 205. Thus, the light flux having passed through the first area 106 is received by the first photoelectric conversion unit 204, and the light flux having passed through the second area 107 is received by the second photoelectric conversion unit 205 for acquiring signals of Image A and Image B.

Figure 3:
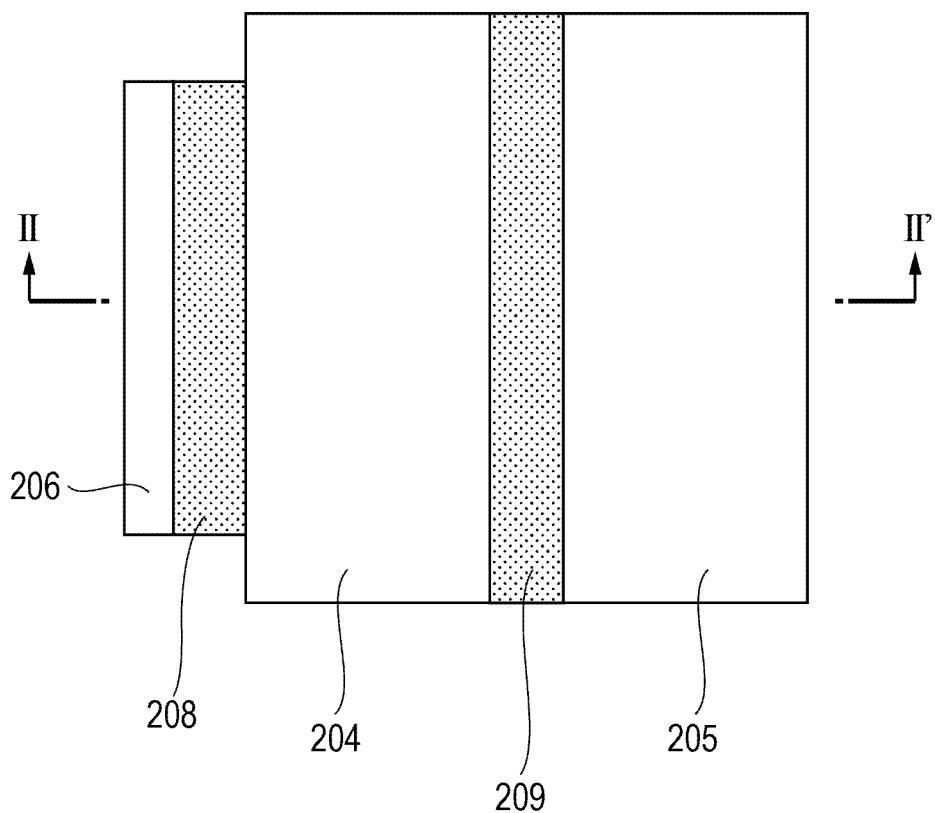
FIG. 3 is a schematic top surface view of a distance detection pixel of the solid-state image pickup element according to an embodiment.

Next, a configuration in which a solid-state image pickup element according to an embodiment may reduce the number of signal detecting circuits to improve the SN ratio of a ranging signal will be described with reference to FIG. 3. FIG. 3 is a schematic diagram of a main part viewed from the top surface of the pixel 200. FIG. 2 is a section view taken at Line II-II' in FIG. 3. The reset transistor, amplify transistor, select transistor within the pixel are omitted for simple description since they may be shared between pixels. In this case, two photoelectric conversion units are provided within a pixel while one signal detecting circuit (such as the FD unit 206) which reads the charge amounts of the photoelectric conversion units is provided. Thus, the decrease in ratio of the photoelectric conversion units 204 and 205 occupying the pixel may be suppressed, and the aperture ratio of the photoelectric conversion units within the pixel may be increased. This allows efficient guide and reception of the light incident on the pixel 200 to the photoelectric conversion units. Particularly when the pixel size is equal to or smaller than 4.0 micrometers, the incident light spreads within the pixel and reaches the signal detecting circuit and so on, and noise due to scattering and absorption increases. At the same time, the quantity of light reaching the photoelectric conversion units decreases, which goes down the SN ratio of a ranging signal. According to the configuration of this embodiment on the other hand, the charge amounts of the two photoelectric conversion units of the first and second photoelectric conversion units 204 and 205 are detected by the one shared signal detecting circuit, which may improves the SN ratio of the ranging signal and increases the accuracy of the distance detection.

Figure 4:
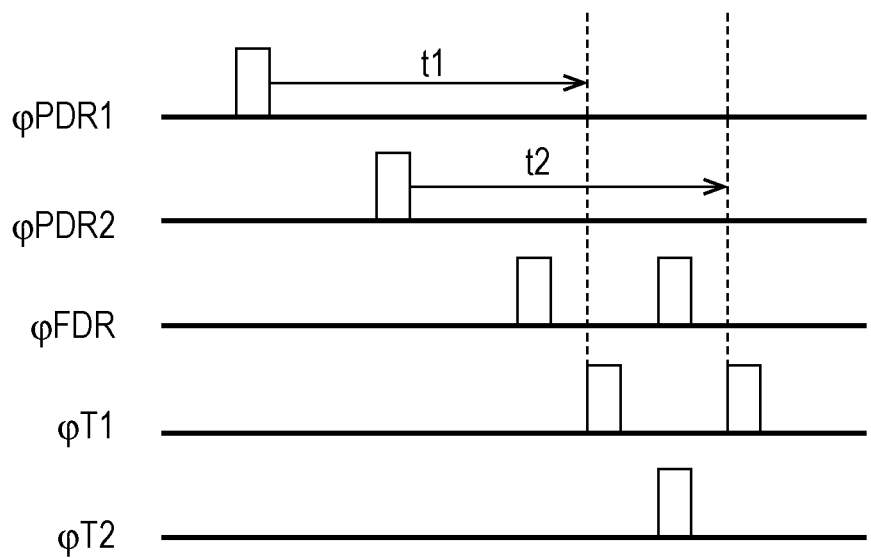
FIG. 4 illustrates a time chart for distance detection by the solid-state image pickup element according to an embodiment.
Figure 5A:
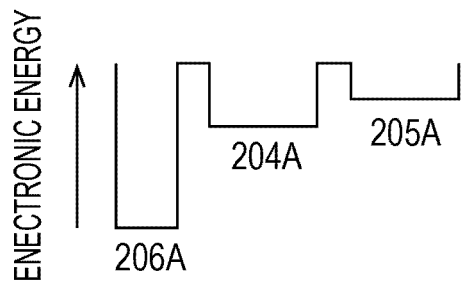
FIGS. 5A to 5F illustrate electronic energies in the distance detection by the solid-state image pickup element according to an embodiment.
Figure 5D:
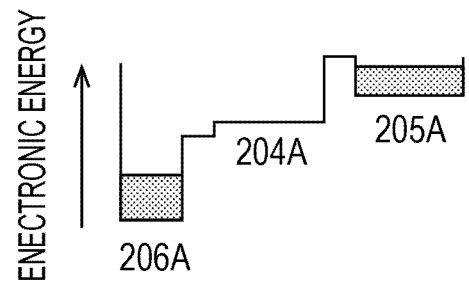
Figure 5B:
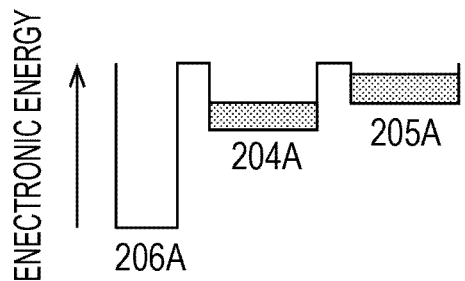
Figure 5E:
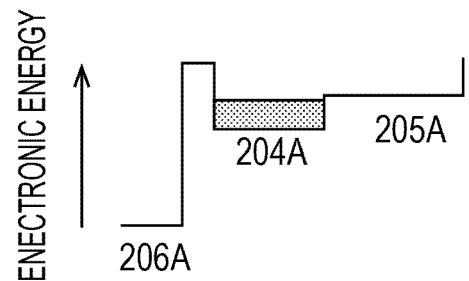

Next, a first measurement mode will be described as an operation of distance detection by a solid-state image pickup element according to this embodiment. In the first measurement mode, the first photoelectric conversion unit and second photoelectric conversion unit are sequentially detected. In this case, an operation flow will be described in which one signal detecting circuit within a pixel reads a signal in the pixel 200, for example. FIG. 4 is a timing chart illustrating a drive signal for reading signals from the first photoelectric conversion unit 204 and second photoelectric conversion unit 205. FIGS. 5A to 5F illustrate electronic energies and electron densities of the first photoelectric conversion unit 204 and second photoelectric conversion unit 205. The first photoelectric conversion unit has electronic energy 204A, the second photoelectric conversion unit has electronic energy 205A, and the FD unit has electronic energy 206A. First of all, in order to reset the charges in the photoelectric conversion units, the PD reset transistors ($\phi$PDR1, $\phi$PDR2) are sequentially turned ON. This allows discharge of the unnecessary charges in the first photoelectric conversion unit and second photoelectric conversion unit to the power supply (FIG. 5A). Then, the PD reset transistors ($\phi$PDR1, $\phi$PDR2) are turned off, and the exposure to the photoelectric conversion units are started (FIG. 5B). In this case, it is set to adjust the timings for turning on the $\phi$PDR1 and $\phi$PDR2 such that the exposure time t1 of the first photoelectric conversion unit and the exposure time t2 of the second photoelectric conversion unit.

Figure 5C:
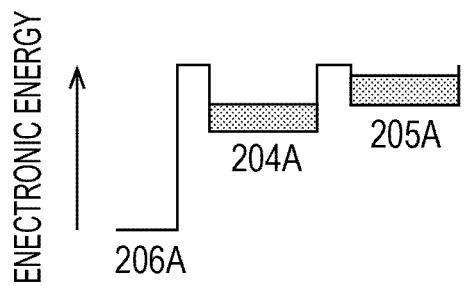

Next, in order to reset the charges in the FD unit 206, the FD reset transistor ($\phi$FDR) is turned on. This discharges the unnecessary charges in the FD unit to the power supply (FIG. 5C). Next, the $\phi$FDR is turned off, and the output value at the reset state is detected. Next, in order to transfer the charges in the first photoelectric conversion unit 204 to the FD unit 206, a signal is applied to the gate electrode 208 to turn on the transfer transistor ($\phi$T1). After that, the output value of the FD unit 206 is read (FIG. 5D), and is differentially detected from the output value at the reset state of the FD unit 206 to detect the charge amount of the first photoelectric conversion unit 204. Next, in order to transfer the charges in the second photoelectric conversion unit 205 to the first photoelectric conversion unit 204, a signal is applied to the gate electrode 209 to turn on the transfer transistor ($\phi$T2). In this case, the FD reset transistor ($\phi$FDR) is turned on (FIG. 5E) to reset the charge in the FD unit at the same time. As described above, because it is configured such that the impurity density of the first photoelectric conversion unit 204 may be higher than the impurity density of the second photoelectric conversion unit 205, the electronic energy of the first photoelectric conversion unit is lower than the electronic energy of the second photoelectric conversion unit. This allows efficient transfer of the charges in the second photoelectric conversion unit to the first photoelectric conversion unit.

Figure 5F:
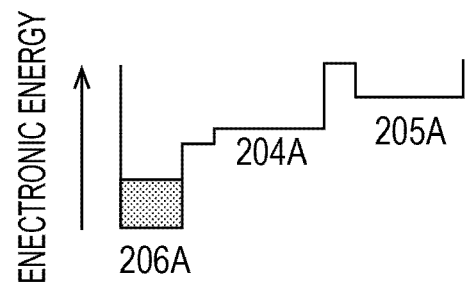

Next, in order to transfer charges of the second photoelectric conversion unit 205 which have been transferred to the first photoelectric conversion unit 204 to the FD unit 206, the transfer transistor ($\phi$T1) is turned on, and the output value of the FD unit is then read (FIG. 5F). Differential detection from the output value at the reset state of the FD unit 206 may detect the charge amount of the second photoelectric conversion unit 205. In this manner, the charge amounts of the first photoelectric conversion unit 204 and second photoelectric conversion unit 205 may be read by using the same FD unit 206. In order to acquire image information on a subject along with the distance information, the charge amounts of the first photoelectric conversion unit 204 and second photoelectric conversion unit 205 are added in the operating unit 103 after detected. Because the added signal is an image signal having passed through the all areas of the exit pupil, the distance detection pixels may be used to acquire the subject image. According to this embodiment, the storage time t1 of the first photoelectric conversion unit 204 and the storage time t2 of the second photoelectric conversion unit 205 are equal, but the storage times may differ. In this case, the difference between the storage times may be used to improve the dynamic range or for movement vector detection function on a subject.

Figure 6:
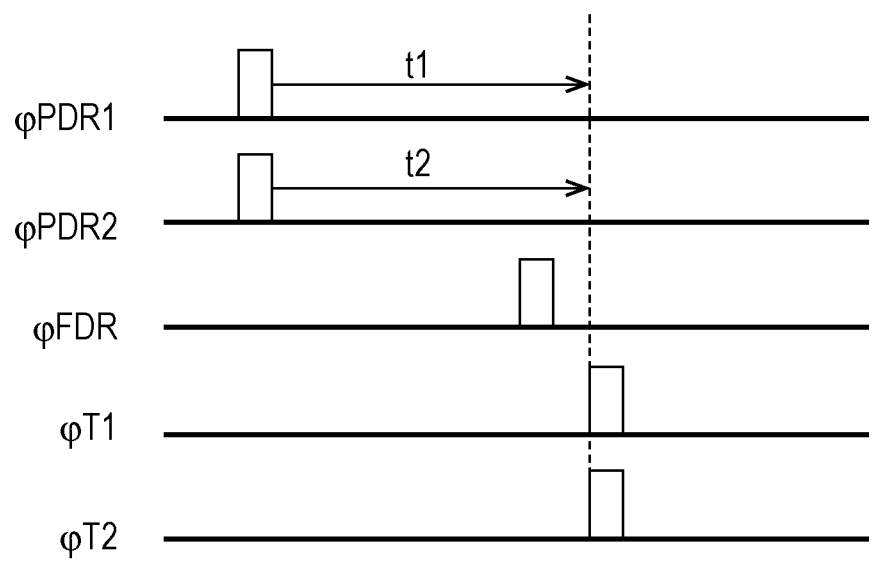
FIG. 6 illustrates a time chart for imaging by the solid-state image pickup element according to an embodiment.
Figure 7A:
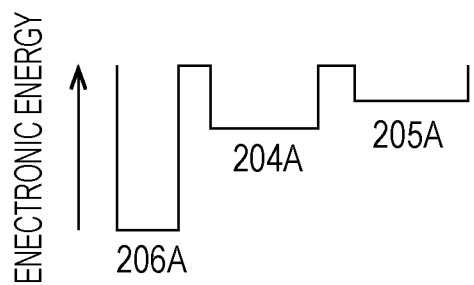
FIGS. 7A to 7D illustrate electronic energies in the imaging by the solid-state image pickup element according to an embodiment.
Figure 7C:
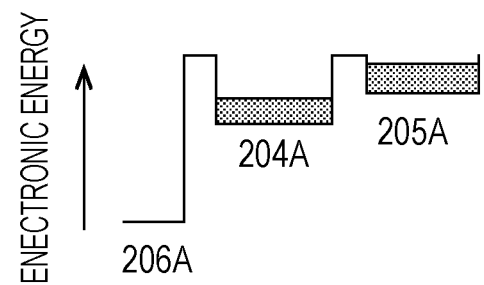
Figure 7B:
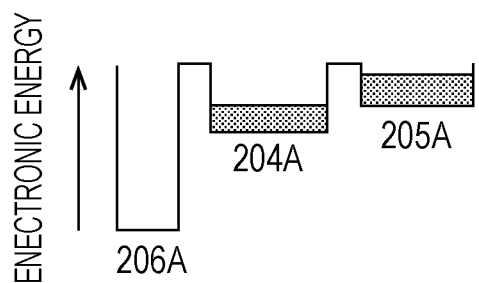
Figure 7D:
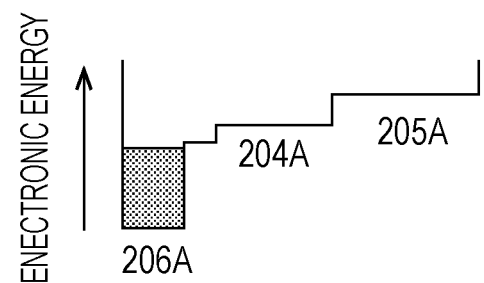

Next, a second measurement mode will be described as an operation of distance detection by the solid-state image pickup element according to this embodiment. In the second measurement mode, in order to acquire a subject image quickly, all photoelectric conversion units (first photoelectric conversion unit 204 and second photoelectric conversion unit 205) within a pixel are read simultaneously. Here, an operation flow for reading a signal to acquire image information only in the pixel 200 will be described, an example of an operation of image detection by the solid-state image pickup element of this embodiment. FIG. 6 is a timing chart illustrating a drive signal for reading the added signal of the first photoelectric conversion unit 204 and second photoelectric conversion unit 205. FIGS. 7A to 7D illustrate electronic energies and electron densities of the first photoelectric conversion unit 204 and second photoelectric conversion unit 205. First of all, in order to reset the charges in the photoelectric conversion units, the PD reset transistors (φPDR1, φPDR2) are turned ON at the same time. This allows discharge of the unnecessary charges in the first photoelectric conversion unit and second photoelectric conversion unit to the power supply (FIG. 7A). Then, the PD reset transistors (φPDR1, φPDR2) are turned off, and the exposure to the photoelectric conversion units are started (FIG. 7B). Next, in order to reset the charges in the FD unit 206, the FD reset transistor (φFDR) is turned on. This discharges the unnecessary charges in the FD unit to the power supply (FIG. 7C). Next, the φFDR is turned off, and the output value at the reset state is detected. Next, in order to transfer the charges as a result of the addition of those of the first photoelectric conversion unit 204 and second photoelectric conversion unit 205 to the FD unit 206, the transfer transistors (φT1, φT2) are turned on. After that, the output value of the FD unit 206 is read (FIG. 7D), and is differentially detected from the output value at the reset state of the FD unit 206 to detect the charge amount of the added charges of the first photoelectric conversion unit 204 and the second photoelectric conversion unit 205. In this manner, distance detection pixels may be used to acquire image information only on a subject. The use of this operation method may eliminate the necessity for separate reading of charge amounts of a plurality of photoelectric conversion units, compared with the acquisition of distance information. Reading the added charges of the photoelectric conversion units allows quick reading of the charge amounts. Furthermore, this does not cause a difference in exposure time between the first photoelectric conversion unit 204 and the second photoelectric conversion unit 205.

Figure 8:
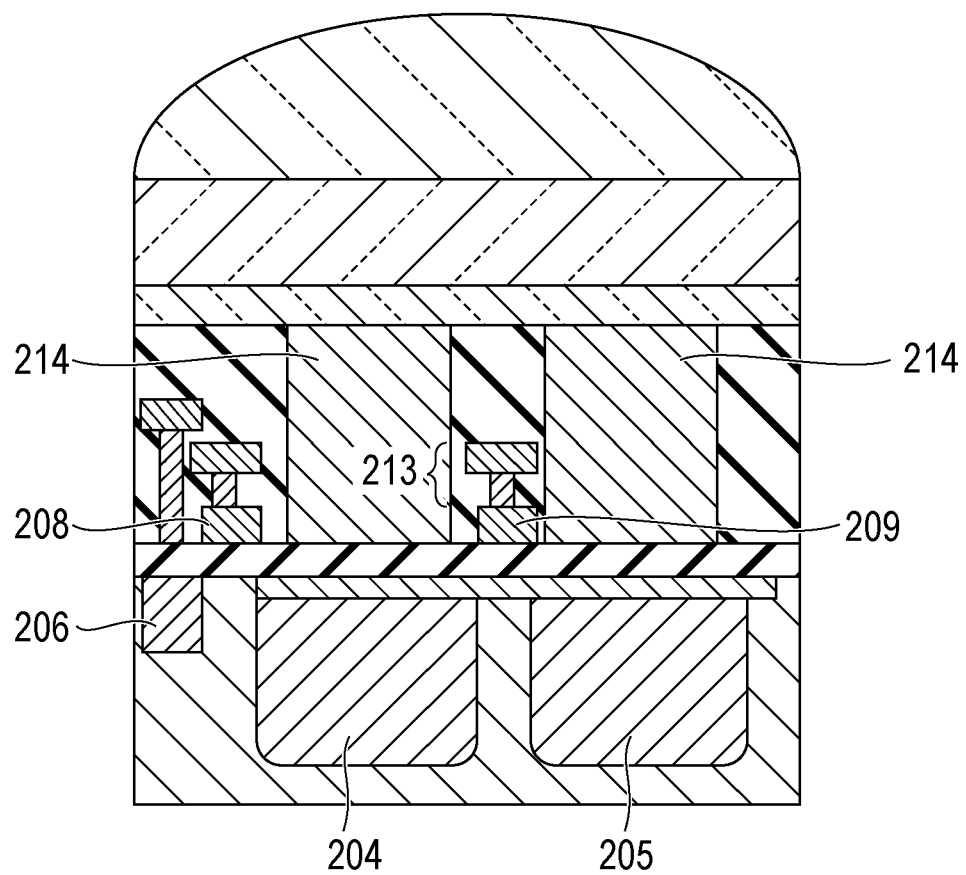
FIG. 8 illustrates another configuration of the solid-state image pickup element according to an embodiment.

According to this embodiment, the solid-state image pickup element is a backside-illuminated solid-state image pickup element including electrodes and wires and has the first and second photoelectric conversion units on the side at which light incidents rather than the side having the electrodes and wires. However, the disclosure is not limited thereto. A frontside-illuminated solid-state image pickup element as illustrated in FIG. 8 is applicable. That is, the solid-state image pickup element has electrodes and wires on the side at which light incidents rather than the side having the first and second photoelectric conversion units. Also in this case, the application of the configuration of the signal detecting circuit according to an embodiment may increase the aperture ratio of the photoelectric conversion units and increase the SN ratio of the ranging signal. Furthermore, because the numbers of electrodes and wires also decrease, the incident light within the pixel does not easily scatter, which may reduce crosstalk noise. In order to prevent scattering and absorption of incident light in the gate electrode 209 and wires 213 disposed at the center of the pixel, a waveguide structure 214 having a higher index than surroundings may be provided immediately above the photoelectric conversion units. This may reduce the scattering due to the gate electrode 209 and wires 213 and may reduce crosstalk noise.

Figure 9:
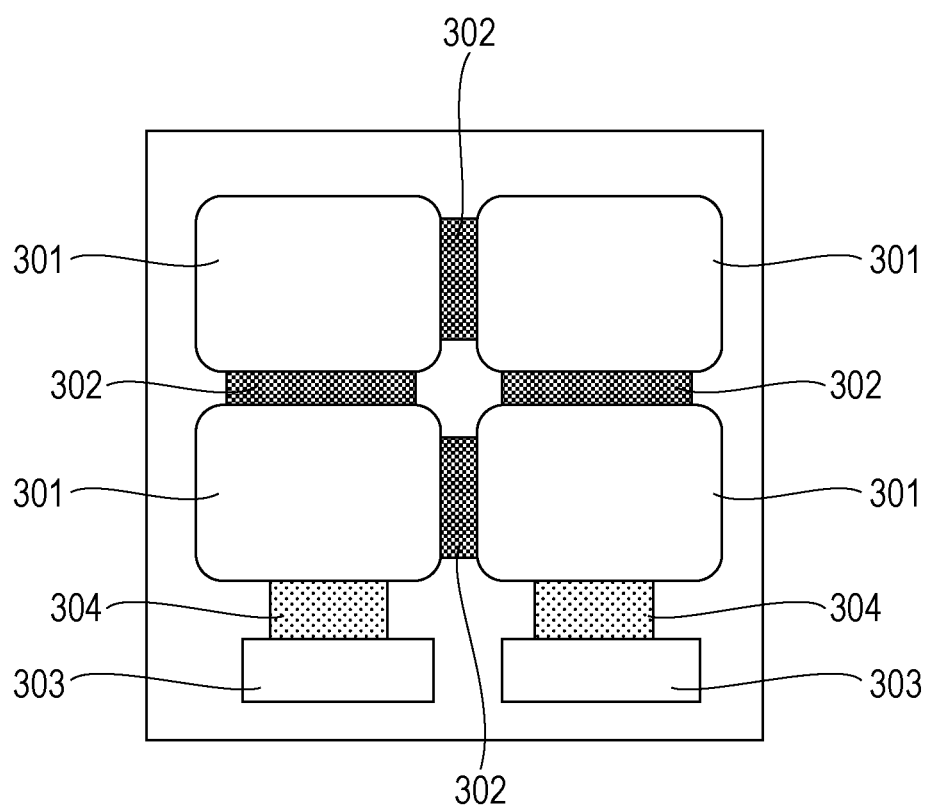
FIG. 9 illustrates another configuration of the solid-state image pickup element according to an embodiment.

The number of photoelectric conversion units within the distance detection pixels is not limited to two but may be four, for example, as illustrated in FIG. 9. In this case, because the exit pupil may be divided vertically and horizontally, highly accurate distance detection may be performed on either vertical or horizontal subject. FIG. 9 illustrates a top surface of the distance detection pixel in which four photoelectric conversion units 301, and four gate electrodes 302 between the photoelectric conversion units and two FD units 303 and two gate electrodes 304 that control the transfer to the FD units are provided. In this manner, the configuration having a lower number of FD units than the number of photoelectric conversion units in which the charge amount is read from a common FD unit may increase the aperture ratio of the photoelectric conversion units. Therefore, even four photoelectric conversion units may keep the SN ratio high and allow highly accurate distance detection. The configuration illustrated in FIG. 9 allows arbitrary control over vertical and horizontal divisions of the area of the exit pupil in accordance with the signal of the gate electrode 302 provided between the photoelectric conversion units.

Figure 10A:
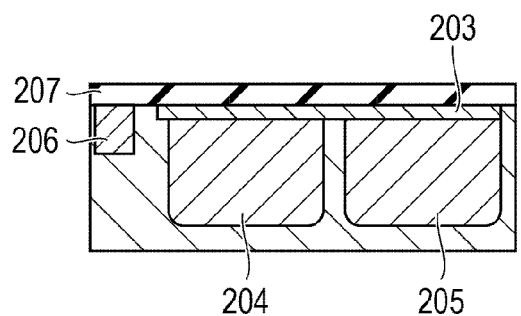
FIGS. 10A to 10D illustrate manufacturing processes for the solid-state image pickup element including a pixel for distance measurement according to an embodiment.

Next, a manufacturing method for a solid-state image pickup element according to this embodiment will be described. A manufacturing process for a solid-state image pickup element including the pixel 200 according to this embodiment will be described with reference to FIGS. 10A to 10D. First, thermal oxidation forms a gate insulating layer 207 on a surface of a silicon semiconductor 201. Then, in order to form the photoelectric conversion units 204 and 205 and the FD unit 206 in the semiconductor 201, a resist mask is formed at a predetermined position by using photoresist, and ion of impurities are implanted therein. After that, the resist mask is removed by aching or the like. Then, a diffusion layer (not illustrated) is formed by the same ion implantation method (FIG. 10A).

Figure 10B:
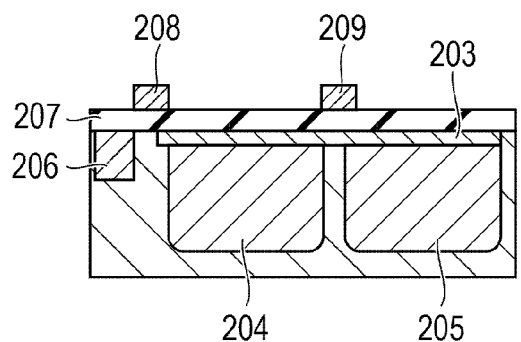
Figure 10C:
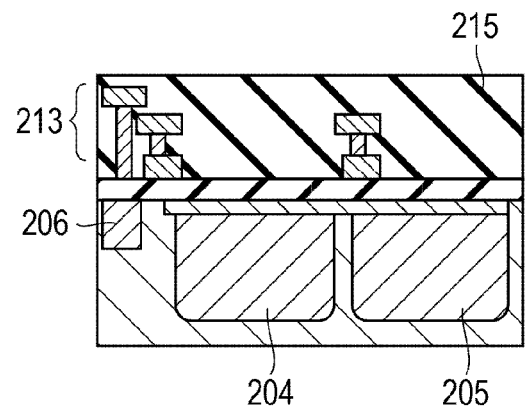
Figure 10D:
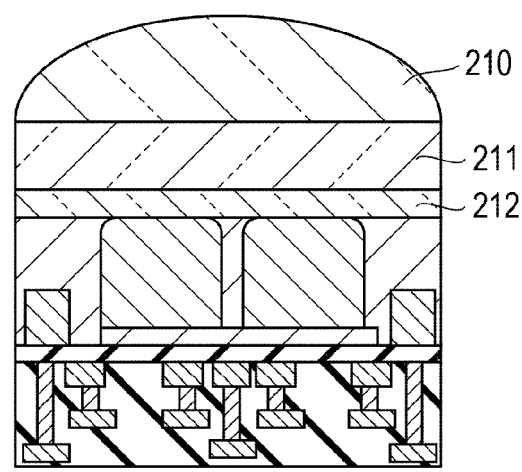

A polysilicon film is further formed in order to form a gate electrode to transfer charges generated in the photoelectric conversion units 204 and 205. After that, a photolithography process is used to etch the polysilicon film into a predetermined pattern to form gate electrodes 208 and 209 (FIG. 10B). After that, the semiconductor 201 and interlayer insulating layer 215 such as a BPSG are formed on the gate electrodes and are flattened by a CMP method. Next, for electrical connection, a connection hole such as a contact hole is formed in the interlayer insulating layer, and another metal wire is used to implement the electrical connection. A wiring 213 is formed in the same manner, covered by the interlayer insulating layer 215 (FIG. 10C). Then, the opposite side of the gate insulating layer 207 of the semiconductor 201 is polished and thinned until the photoelectric conversion unit is exposed. After that, the planarizing layer 212, a color filter 211, and a microlens 210 are formed as required (FIG. 10D).

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2011-253462 filed Nov. 21, 2011, which is hereby incorporated by reference herein in its entirety.

What is claimed is:

1. A solid-state image pickup element comprising:
   a pixel having at least two photoelectric conversion units including a first photoelectric conversion unit and a second photoelectric conversion unit in a semiconductor; and
   one signal detecting unit which commonly detects the charge amount in the first photoelectric conversion unit and the second photoelectric conversion unit,
   wherein the first photoelectric conversion unit has a higher impurity density than the second photoelectric conversion unit and is configured to allow a transfer of a charge occurring in the second photoelectric conversion unit to the first photoelectric conversion unit, and
   wherein the charges occurring in the second photoelectric conversion unit are transferred to the signal detecting unit through the first photoelectric conversion unit.

2. The solid-state image pickup element according to claim 1, wherein the signal detecting unit detects the charge amount stored in the first photoelectric conversion unit and then detects the charge amount stored in the second photoelectric conversion unit.

3. The solid-state image pickup element according to claim 1, wherein an exposure time of the first photoelectric conversion unit is equal to an exposure time of the second photoelectric conversion unit.

4. The solid-state image pickup element according to claim 1, wherein a gate electrode which transfers charges generated in the second photoelectric conversion unit to the first photoelectric conversion unit is provided between the first photoelectric conversion unit and the second photoelectric conversion unit.

5. The solid-state image pickup element according to claim 1, comprising a plurality of pixels.

6. The solid-state image pickup element according to claim 5, wherein the size of the pixels is equal to or smaller than 4.0 micrometers.

7. The solid-state image pickup element according to claim 1, further comprising an electrode and a wire, wherein the first and second photoelectric conversion units position on a side at which light incidents rather than a side having the electrode and wire.

8. The solid-state image pickup element according to claim 1, further comprising an electrode and a wire, wherein the electrode and wire position on a side at which light incidents rather than a side having the first and second photoelectric conversion units.

9. A distance detecting apparatus comprising a solid-state image pickup element according to claim 1, having a plurality of pixels, detecting images formed by light fluxes having passed through different areas of an exit pupil of an imaging lens by using the plurality of pixels and detecting a distance based on an amount of displacement of the images.

10. The distance detecting apparatus according to claim 9, wherein an operation for detecting the distance has at least two measurement modes including a first measurement mode and a second measurement mode, wherein
    the first measurement mode sequentially detects the first photoelectric conversion unit and the second photoelectric conversion unit, and
    the second measurement mode simultaneously detects the first photoelectric conversion unit and the second photoelectric conversion unit.

11. A camera comprising the distance detecting apparatus according to claim 9.

* * * * *